United States Patent
Levesque et al.

(10) Patent No.: US 11,800,641 B2
(45) Date of Patent: Oct. 24, 2023

(54) COMPOSITE PANEL COMPRISING AN INTEGRATED ELECTRICAL CIRCUIT AND MANUFACTURING METHOD THEREOF

(71) Applicant: HUTCHINSON AERONAUTIQUE & INDUSTRIE LTÉE., Montréal (CA)

(72) Inventors: Martin Levesque, Terrebonne (CA); Jean-Philippe Larose, Montréal (CA); Franck Guillemand, Ste-Catherine (CA)

(73) Assignee: HUTCHINSON AERONAUTIQUE & INDUSTRIE LTÉE., Montréal (CA)

( * ) Notice: Subject to any disclaimer, the term of this patent is extended or adjusted under 35 U.S.C. 154(b) by 226 days.

(21) Appl. No.: 16/899,950

(22) Filed: Jun. 12, 2020

(65) Prior Publication Data

US 2021/0037645 A1     Feb. 4, 2021

Related U.S. Application Data

(60) Provisional application No. 62/861,636, filed on Jun. 14, 2019.

(51) Int. Cl.
*H05K 1/03* (2006.01)
*H05K 1/18* (2006.01)
(Continued)

(52) U.S. Cl.
CPC .......... *H05K 1/0366* (2013.01); *B29C 70/48* (2013.01); *B29C 70/70* (2013.01); *B64C 7/00* (2013.01);
(Continued)

(58) Field of Classification Search
CPC .... H05K 1/021; H05K 1/0212; H05K 1/0215; H05K 1/023; H05K 1/0231; H05K 1/0233; H05K 1/0234; H05K 1/0243; H05K 1/0295; H05K 1/14; H05K 1/141; H05K 1/142; H05K 1/144; H05K 1/145; H05K 1/16; H05K 1/162; H05K 1/165; H05K 1/167; H05K 1/18; H05K 1/181; H05K 1/182; H05K 1/183; H05K 1/184; H05K 1/185; H05K 3/30; H05K 3/32;
(Continued)

(56) References Cited

U.S. PATENT DOCUMENTS

| 4,374,080 A | 2/1983 | Schroeder |
| 4,824,714 A | 4/1989 | Gest |

(Continued)

FOREIGN PATENT DOCUMENTS

| DE | 3608938 A1 | 9/1987 |
| EP | 3 202 665 A1 | 8/2017 |

(Continued)

OTHER PUBLICATIONS

European Search Report from corresponding European Patent Application No. 20 17 9943, completed on Oct. 27, 2020.

*Primary Examiner* — Ishwarbhai B Patel
(74) *Attorney, Agent, or Firm* — Westman, Champlin & Koehler, P.A.

(57) ABSTRACT

Here are described composite panels comprising at least one integrated or embedded electrical circuit, their methods of manufacturing and their use in the aeronautic and aircraft industries. Also described are aircraft components including the composite panel as defined herein.

20 Claims, 10 Drawing Sheets

(51) Int. Cl.
*H05K 3/30* (2006.01)
*B29C 70/48* (2006.01)
*B29C 70/70* (2006.01)
*B64C 7/00* (2006.01)
*B64D 41/00* (2006.01)
*B29L 31/30* (2006.01)
*B29L 31/34* (2006.01)
*H05K 1/11* (2006.01)
*H05K 3/46* (2006.01)

(52) U.S. Cl.
CPC .............. *B64D 41/00* (2013.01); *H05K 1/036* (2013.01); *H05K 1/0313* (2013.01); *B29L 2031/3076* (2013.01); *B29L 2031/3425* (2013.01); *H05K 1/11* (2013.01); *H05K 1/18* (2013.01); *H05K 3/30* (2013.01); *H05K 3/4602* (2013.01)

(58) Field of Classification Search
CPC .... H05K 3/341; H05K 3/3415; H05K 3/3421; H05K 3/3431; H05K 3/36; H05K 3/46; H05K 2201/0317; H05K 2201/041; H05K 2201/049; H05K 2201/09763; H05K 2201/09872; H05K 2201/10446; H05K 2201/10454; H05K 2201/10462; H05K 2201/10469; H05K 2201/10477; H05K 2201/10484; H05K 2201/10492; H05K 2201/105; H05K 2201/10674
See application file for complete search history.

(56) References Cited

U.S. PATENT DOCUMENTS

| | | | |
|---|---|---|---|
| 5,296,651 A * | 3/1994 | Gurrie | H05K 1/118 174/250 |
| 7,349,225 B1 | 3/2008 | Bennett | |
| 7,461,444 B2 | 12/2008 | Deaett et al. | |
| 7,479,313 B2 | 1/2009 | Chang et al. | |
| 8,158,886 B2 | 4/2012 | Johnston | |
| 9,180,629 B2 | 11/2015 | Ender | |
| 9,226,410 B2 | 12/2015 | Johnston | |
| 9,460,990 B1 * | 10/2016 | Sung | H01L 23/562 |
| 9,934,885 B2 * | 4/2018 | Broughton | F02C 7/00 |
| 2003/0003317 A1 | 1/2003 | Chang et al. | |
| 2009/0009080 A1 | 1/2009 | Ji et al. | |
| 2010/0270318 A1 | 10/2010 | Dagher et al. | |
| 2011/0011627 A1 * | 1/2011 | Aspas Puertolas | H05K 3/103 174/251 |
| 2011/0020599 A1 * | 1/2011 | Le Roy | B32B 3/08 28/104 |
| 2015/0083473 A1 * | 3/2015 | Downs | H05K 1/0393 428/110 |
| 2017/0129207 A1 | 5/2017 | Hallander et al. | |
| 2017/0217389 A1 * | 8/2017 | Macaraeg | B32B 7/12 |
| 2017/0254065 A1 * | 9/2017 | Hegenbart | B33Y 80/00 |
| 2018/0295712 A1 | 10/2018 | Heikkinen et al. | |
| 2018/0302987 A1 | 10/2018 | Kramer et al. | |
| 2019/0054996 A1 | 2/2019 | Ibrahim et al. | |
| 2019/0069403 A1 | 2/2019 | Heikkinen et al. | |
| 2019/0069408 A1 * | 2/2019 | Keranen | H05K 3/284 |
| 2019/0069409 A1 | 2/2019 | Keranen et al. | |
| 2019/0072732 A1 | 3/2019 | Seidemann et al. | |
| 2019/0118929 A1 * | 4/2019 | Owens | B32B 27/12 |

FOREIGN PATENT DOCUMENTS

| | | |
|---|---|---|
| EP | 3 287 369 A1 | 2/2018 |
| FR | 2 971 970 B1 | 2/2011 |
| GB | 2 418 542 B | 10/2004 |
| KR | 10-0664693 | 1/2007 |
| WO | 2002085609 A1 | 10/2002 |
| WO | 2013011306 A1 | 1/2013 |
| WO | 2017077193 A1 | 5/2017 |
| WO | 2020031114 A1 | 2/2020 |

\* cited by examiner

COMPOSITE PANEL COMPRISING AN INTEGRATED ELECTRICAL CIRCUIT AND MANUFACTURING METHOD THEREOF

RELATED APPLICATION

This application claims priority under applicable laws to U.S. provisional application No. 62/861,636 filed on Jun. 14, 2019, the content of which is incorporated herein by reference in its entirety for all purposes.

TECHNICAL FIELD

The technical field generally relates to composite panels, their methods of production and their use in the transport industry and, more particularly, to composite panel comprising integrated electrical circuits, their methods of manufacturing and their use in the aerospace and automotive industries.

BACKGROUND

Composite materials are widely used in the aerospace and automotive industries. Compared to the conventional material typically used in these manufacturing industries, composite materials can, for example, provide enhanced mechanical, physical and chemical properties. The use of composite materials can provide high strength-to-weight, stiffness-to-weight ratios, and superior physical properties when compared to traditional materials, such as aluminum. Another advantage of composite materials is that they offer design flexibility which allows them to be moulded into a variety of complex geometries.

One of the key advantages and benefits of using composite materials in the aeronautic industry is the aircraft weight reduction leading to reduced fuel consumption, negative environmental impacts, and direct operating costs of aircraft. For instance, composite materials are widely used in the aeronautic industry in the production of aircraft structures, wing structures, fairings, propellers, and the fuselage. The use of composite materials is also becoming increasingly common in the production of different aircraft cabin interior components such as aircraft interior panels.

Therefore, reducing the weight of aircraft has been a focus of research and development, especially when producing products, materials, devices, and systems. Significant efforts have also been made to develop methods to attempt to further reduce aircraft weight.

However, there is still significant room for innovation with regard to reducing aircraft weight. For example, aircraft have complex electrical systems that significantly contribute to the weight of the aircraft. For instance, commercial aircraft cabins are provided with a variety of cabin electrical and electronic equipment for passengers' safety, convenience, comfort, or entertainment. The electrical and electronic equipment requires an electrical power source provided by an assembly of electrical cables or wires installed behind the cabin interior panels, or on a surrounding structure. The assembly of electrical cables or wires is generally installed using wiring harness mounting brackets. The electrical and electronic equipment thus significantly contributes to the overall weight of the aircraft. Furthermore, the installation of these harnesses also involves extra steps which add constraints to the aircraft manufacturing process, increasing both time and costs associated with aircraft interior or cabin completion.

Accordingly, there is a need for new strategies to overcome one or more of the disadvantages encountered when using conventional aircraft materials. For example, there is still a need for new materials and methods to reduce aircraft weight associated with the electrical and electronic systems.

SUMMARY

According to one aspect, the present technology relates to a composite panel comprising at least one integrated electrical circuit, the composite panel comprising:
a matrix; and
a matrix-permeable reinforced material assembly comprising:
  a first matrix-permeable fabric preform and a second matrix-permeable fabric preform extending in a superposed relationship;
  at least one electrical circuit provided on a film substrate, wherein the at least one electrical circuit is placed between the first and second matrix-permeable fabric preforms, and the film substrate comprises at least one hole and/or opening; and
  at least one electrical or electronic device electrically connected to the at least one electrical circuit.

According to another aspect, the present technology relates to an aircraft component comprising a composite panel as defined herein.

According to a further aspect, the present technology relates to a process for manufacturing a composite panel as defined herein, the process comprising the following steps:
providing a first matrix-permeable fabric preform and a second matrix-permeable fabric preform, each of the first and second matrix-permeable fabric preforms having an inner side and an outer side;
providing at least one electrical circuit between the first and second matrix-permeable fabric preforms, wherein said at least one electrical circuit is provided on a film substrate comprising at least one hole and/or opening;
electrically connecting at least one electrical or electronic device to the at least one electrical circuit; and
connecting the first matrix-permeable fabric preform to the second matrix-permeable fabric preform to obtain a matrix-permeable reinforced material assembly comprising the at least one electrical circuit and the at least one electrical or electronic device.

DETAILED DESCRIPTION

Figure 1:
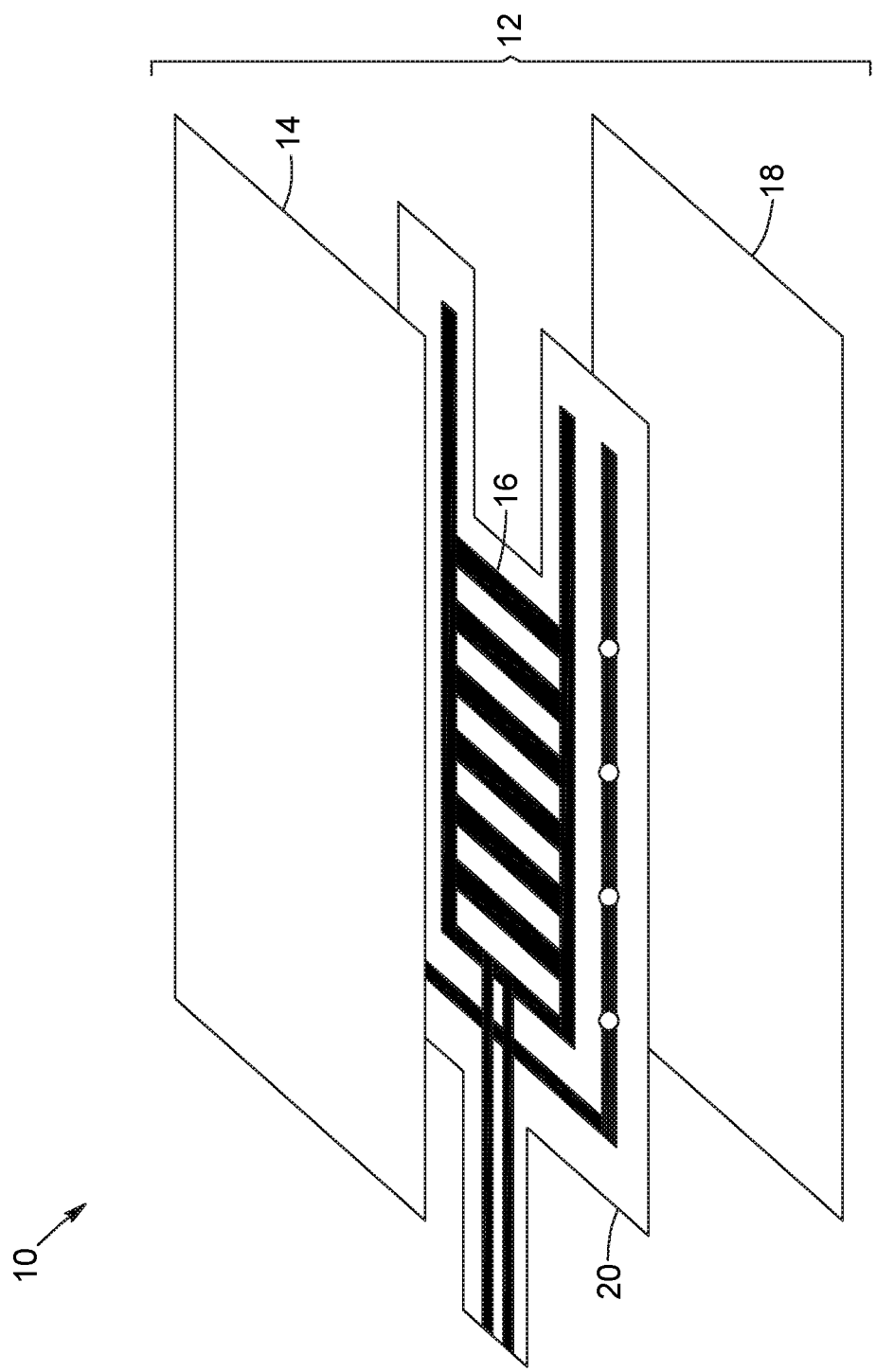
FIG. 1 is a schematic exploded view of a composite panel including an integrated electrical circuit in accordance with an illustrative embodiment of the present invention.

The following detailed description and examples are illustrative and should not be interpreted as further limiting the scope of the invention. On the contrary, it is intended to cover all alternatives, modifications and equivalents as may be included as defined by the present description. The objects, advantages and other features of the present techniques will become more apparent and be better understood upon reading of the following non-restrictive description, given with reference to the accompanying drawings.

All technical and scientific terms and expressions used herein have the same definitions as those commonly understood by the person skilled in the art when relating to the present technology. The definition of some terms and expressions used herein is nevertheless provided below for clarity purposes.

When the term "approximately" or its equivalent term "about" are used herein, it means approximately or in the region of, and around. When the terms "approximately" or "about" are used in relation to a numerical value, it modifies it; for example, by a variation of 10% above and below its nominal value. This term may also take into account rounding of a number or the probability of random errors in experimental measurements.

It is worth mentioning that throughout the following description when the article "a" or "an" is used to introduce an element, it does not have the meaning of "only one" and rather means "one or more". It is to be understood that where the specification states that a step, component, feature, or characteristic "may", "might", "can" or "could" be included, that particular component, feature or characteristic is not required to be included in all alternatives. When the term "comprising" or its equivalent terms "including" or "having" are used herein, it does not exclude other elements. If a group is defined hereinafter to include at least a certain number of embodiments, it is also to be understood to disclose a group, which preferably consists only of these embodiments.

When a range of values is mentioned herein, the lower and upper limits of the range are, unless otherwise indicated, always included in the definition. When a range of values is mentioned in the present application, then all intermediate ranges and subranges, as well as individual values included in the ranges, are intended to be included.

For more clarity, the expression "composite material" as used herein refers to a multiphase material comprising at least two constituents separated by an interface and having different chemical and/or physical properties. The composite material can offer a substantially high strength-to-weight ratio, a substantially high stiffness-to-weight ratio, and/or improved physical properties. The composite material can be a reinforced composite material including reinforcing phase (e.g. a textile preform) embedded in continuous matrix phase such as a binder or a resin (e.g. a low-viscosity resin). For instance, the composite material can be a fiber-reinforced composite. For example, the composite material or the reinforced composite material can include fiberglass, carbon fibers, synthetic fibers, aramid fibers, Kevlar™ fibers, or a combination of at least two thereof when compatible.

For more clarity, the expressions "pre-impregnated composite" and "prepreg" as used herein refer to a composite material in which the reinforcing phase is pre-impregnated with the matrix.

When the term "hole" or its equivalent term "opening" are used herein, it means an aperture, a perforation, a gap, a slit, a passage, and any other type of space large enough to allow the matrix to flow through.

A composite material, a fibre-reinforced matrix system, a reinforced material, a fabric preform, a matrix, a binder, a resin, an electrical device, an electronic device, an aircraft interior component, an external power supply, an electrical installation, an electromechanical device, an electrical connector, or a manufacturing process other than those specifically exemplified can be employed in the practice of the invention without resorting to undue experimentation. All compatible equivalents known in the art of any of these materials and methods are also contemplated.

Various techniques described herein are related to reducing weight or minimizing completion costs, and delays associated with electrical and electronic systems.

In the present application, composite panels comprising at least one integrated or embedded electrical circuit, their methods of manufacturing, and their use in the transport industry are described. For example, the composite panel can be used in the aerospace, railway, land or road transport, and automotive industries. The composite panel can be used in a vehicle component or system. Non-limiting examples of vehicles include a wagon, a bicycle, a motor vehicle, a motorcycle, a car, a truck, a bus, a railed vehicle, a train, a tram, a watercraft, a ship, a boat, an amphibious vehicle, a screw-propelled vehicle, a hovercraft, an aircraft, an airplane, a helicopter and a spacecraft. In one variant of interest, the composite panel can be used in the aeronautic and aircraft industries, for example, the composite panel can be used in an aircraft component.

More particularly, the present technology relates to a composite panel including at least one integrated electrical circuit.

For a more detailed understanding of the disclosure, reference is first made to FIG. 1, which provides a schematic illustration of a composite panel including at least one integrated electrical circuit 10 in accordance with a possible embodiment.

Figure 10:
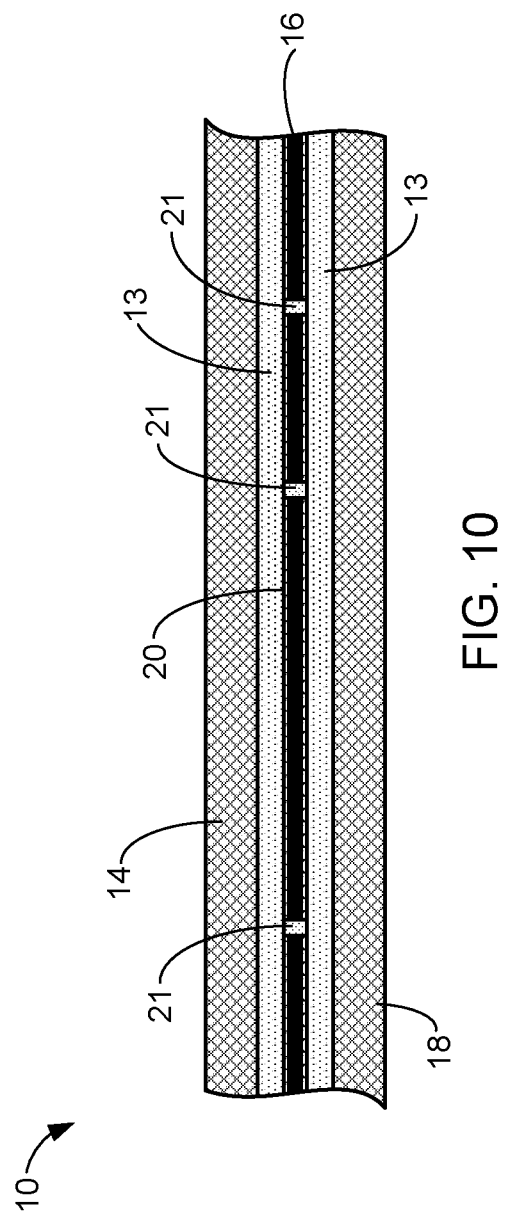
FIG. 10 is simplified cross-sectional view of the composite panel of FIG. 1 in accordance with an illustrative embodiment of the present invention.

As illustrated in FIGS. 1 and 10, the composite panel 10 includes a matrix-permeable reinforcing material assembly 12, and a matrix 13 (FIG. 10). The matrix-permeable reinforcing material assembly 12 a first matrix-permeable fabric preform 14 having an inner and an outer side. The matrix-permeable reinforcing material assembly 12 also includes at least one electrical circuit 16 provided on the inner side of the first matrix-permeable fabric preform 14 and at least one electrical or electronic device (not shown in FIG. 1) connected to the at least one electrical circuit 16. The matrix-permeable reinforcing material assembly 12 further includes a second matrix-permeable fabric preform 18 having an inner and an outer side.

As illustrated in FIG. 1, the at least one electrical circuit 16 is provided on a film substrate 20. The film substrate 20 is provided with at least one hole and/or opening 21 (FIG. 10) to minimize a surface area of the film substrate 20. In one variant of interest, the film substrate 20 can be provided with a plurality of holes and/or openings 21, as shown in FIG. 10. For example, the at least one hole and/or opening 21 can be large enough to allow for the passage of the matrix 13 from a first side to a second side of the film substrate 20. For instance, the at least one hole and/or opening 21 can provide a desired matrix flow through the film substrate 20 and form a matrix distribution network. The at least one hole and/or opening can substantially improve the impregnation of the matrix-permeable reinforcing material assembly 12 by the matrix 13 and thereby increasing the adhesion between the components of the composite panel 10 and substantially reduce or completely avoid the delamination of the composite panel 10. For example, the at least one hole and/or opening 21 can be of any predetermined size or shape to improve the passage of the matrix 13. Alternatively, the film substrate 20 can have a configuration that follows the shape of the at least one electrical circuit 16 to minimize the surface area of the film substrate 20.

In some examples, the film substrate 20 has a surface area of less than about 85% of the surface area of the composite panel 10. For example, the film substrate 20 can have surface area of less than about 75%, or less than about 65%, or less than about 55%, or less than about 45%, or less than about 35%, or less than about 25%, or less than 15%, or less than about 5% of the surface area of the composite panel 10.

Still referring to the illustrated embodiment of FIG. 1, the first matrix-permeable fabric preform 14 and the second matrix-permeable fabric preform 18 extend in a superposed relationship. The at least one electrical circuit 16 is placed between the first matrix-permeable fabric preform 14 and the second matrix-permeable fabric preform 18. It is to be understood that the inner sides of the first matrix-permeable fabric preform 14 and the second matrix-permeable fabric preform 18 are facing each other.

The matrix-permeable reinforcing material assembly 12 and the matrix can be combined using any suitable standard impregnation, infusion, or injection techniques known in the art. For example, the first 14 and second 18 matrix-permeable fabric preforms can be dry fabric preforms and a technique such as resin-transfer moulding (RTM), light resin transfer moulding (Light RTM) or vacuum assisted resin transfer moulding (VARTM) is used to permeate the matrix-permeable reinforcing material assembly 12. Alternatively, the first 14 and second 18 matrix-permeable fabric preforms can be prepreg (or pre-impregnated) preforms in which the preforms are pre-impregnated with the matrix. The matrix can be cured using any compatible technique known in the art. For instance, the matrix can be cured using an autoclave curing method, or an out-of-autoclave curing method, for example, at a temperature and/or pressure selected to adequately cure the matrix.

The at least one electrical or electronic device can be integrated or embedded electrical or electronic device in a manner consistent with the intended function of the at least one electrical or electronic device. For instance, the at least one electrical or electronic device can be integrated or embedded within the matrix-permeable reinforcing material assembly 12. Alternatively, the electrical or electronic device can be a component separated from the composite panel 10 provided that the electrical or electronic device is connected to the at least one electrical circuit 16. It is to be understood that the electrical or electronic device can be removed from the composite panel 10, for example, to be repaired or replaced.

The structure of the composite panel 10 can be selected from any known composite structure. For instance, the composite structure can be selected for its compatibility with various elements of the aircraft and with respect to aerospace material standards (ASTM) or aircraft standards. Examples of composite structures include, without limitation, a monolithic structure, a sandwich structure, and a sandwich structure with a honeycomb core or a foam core. In some examples, the composite panel 10 has a monolithic composite structure. The monolithic composite panel can include a laminate made from a continuous fiber reinforced composite material such as a continuous fiber reinforced thermoplastic composite (CFRTP) material.

In some examples, the composite panel 10 is designed to be installed inside an aircraft. For example, the composite panel 10 is designed to be installed inside on an aircraft fuselage or on an aircraft structural support. The composite panel 10 can be designed for retrofitting an aircraft interior. For instance, the composite panel 10 can be designed for either permanent or temporary installation inside an aircraft to meet an aircraft manufacturer's specific needs while respecting ASTM or aircraft standards.

In some examples, the composite panel 10 further includes an integration or installation assembly (not show in FIG. 1). For example, the integration or installation assembly can be moulded in the composite panel 10. In some examples, the integration or installation assembly includes inserts designed for fixing the composite panel 10 onto an aircraft structural support. Any type of compatible insert is contemplated. For example, the integration or installation assembly can include a device for securing, fastening, and/or fitting the composite panel 10 to an aircraft structural support.

In some examples, the composite panel 10 further includes a reinforcement assembly (not shown in FIG. 1). For example, the reinforcement assembly can be moulded in the composite panel 10. The reinforcement assembly can, for example, substantially increase the strength-to-weight ratio of the composite panel 10. Any type of compatible reinforcement assembly is contemplated. For example, the reinforcement assembly can include a reinforcement ducting or a system of reinforcement ducts.

In some examples, the composite panel 10 further includes a panel cover or lining (not shown in FIG. 1). For example, the panel cover or lining can consist of a layer of synthetic film. The panel cover or lining can be included for decorative and esthetic purposes. For example, the panel cover or lining can be moulded, attached, or glued in the composite panel 10.

The composite panel 10 can be a single composite panel. Alternatively, the composite panel 10 can be designed to be modular, for example, a plurality of composite panels 10 can be assembled together. For instance, the composite panel 10 can connect with at least one adjacent composite panel 10 to form an interconnected or interlocked modular composite panel section comprising a plurality of composite panels 10 each including at least one integrated electrical circuit. For example, the composite panel 10 can be designed to be modular to facilitate the installation, removal, maintenance, or replacement of the composite panel 10. The composite panel 10 can be adapted or customized be suitable for different aircraft interior components or different aircraft types to satisfy the specific needs of aircraft manufacturers.

For example, the composite panel 10 can be designed into a variety of shapes and thicknesses to satisfy requirements of every aircraft. The composite panel 10 can, for example, be designed to conceal cavities, controls, tubing, wiring and the like. For instance, the aircraft interior component can be customized for comfort, safety, convenience, entertainment, or esthetic and decorative purposes. In some examples, the composite panel 10 can be designed, fabricated, and/or pre-assembled, for example, to reduce aircraft interior completion costs.

In some examples, the composite panel 10 is a constituent of an aircraft interior component. Non-limiting examples of aircraft interior components include a lining panel, a decor panel, a cabin panel, a cockpit panel, an entrance panel, a service area panel, a baggage compartment panel, a cargo compartment panel, a wardrobe panel, a lavatory panel, a sidewall panel, a cabin sidewall, a cabin console, a side console, a central pedestal, a glare shield skin, a window post, a cabin bulkhead, a bulkhead, a lower wall panel, a ceiling panel, a cabin backseat shell, a headliner, a passenger service unit panel, a door or doorframe panel, and a floor panel. In some example, the aircraft interior component can be a reported part, or a part added to an aircraft component, for example, a decorative molding. In some example, the reported part can be designed to be removably or permanently installed on an aircraft interior component including the composite panel 10. For instance, the reported part can be installed on the composite panel 10 using at least one of adhesive bonding, mechanical inserts, and clips. For example, said reported part can include the at least one electrical or electronic device.

In some examples, the first 14 and second 18 matrix-permeable fabric preforms can independently include high performance multifilament fibers, such as glass fibers, carbon fibers, hybrid carbon-glass fibers, aramid fibers, boron fibers, basalt fibers, and natural fibers. For example, the first 14 and second 18 matrix-permeable fabric preforms can include parallel filaments (roving), untwisted strands, yarns, fibers, filaments, chopped strands, a woven fabric, or a fibrous mat. For instance, the first 14 and second 18 matrix-permeable fabric preforms can independently be a woven, a non-woven, a knitted (e.g. a warp knitted or a circular knitted), or a braided preform. In one variant of interest, the first 14 and second 18 matrix-permeable fabric preforms are made of the same material which can be selected its compatibility with various elements of the aircraft and with respect to ASTM or aircraft standards.

In some examples, the first 14 and second 18 matrix-permeable fabric preforms are substantially permeable to the matrix. For instance, the first 14 and second 18 matrix-permeable fabric preforms are substantially permeable to allow a substantially uniform and/or substantially complete impregnation of the matrix-permeable reinforcing material assembly 12 by the matrix. The permeability of the fabric preforms is a measure of the resistance to matrix flow. An increase in permeability of the fabric preforms can lead to an increase in the adhesion between the components of the composite panel 10. For instance, the first 14 and second 18 matrix-permeable fabric preforms can include voids, pores, or micropores allowing the matrix to flow through them.

In some examples, the matrix can be a binder or a resin. For example, the matrix can be a resin, for example, a thermoset or a thermoplastic resin. Non-limiting examples of matrices include epoxy resins, phenolic resins, vinyl ester resins, polyester resins, polyurethane resins, cyanate ester resins, silicone rubber, polyetherimide (PEI), polyphenylsulfone (PPSU), polyetheretherketone (PEEK), polyphenylene sulfide (PPS), polyetherketoneketone (PEKK), polyaryletherketon (PAEK), polycarbonates (PC) and polyamide (PA). The matrix may be selected from any suitable matrix known in the art and can be selected for its compatibility with various elements of the aircraft and with respect to ASTM or aircraft standards. In some example, the matrix further includes at least one curing agent and/or at least one accelerator.

It is to be understood that the composite panel 10 is designed to be active or electrically active. The at least one electrical circuit 16 includes at least one electrical conductor material. Examples of electrical conductor materials include, without limitation, copper, aluminum, gold, and silver. The at least one electrical conductor material can be selected from any suitable electrical conductor material known in the art. The at least one electrical conductor material can be selected for its compatibility with various elements of the aircraft and with respect ASTM to or aircraft standards. The at least one electrical conductor material can also be selected for its properties, for example, for its electrical conductivity, tensile strength, ductility, creep resistance, corrosion resistance, thermal conductivity, coefficient of thermal expansion, solderability, resistance to electrical overload, compatibility with electrical insulators, or its ease of installation.

In some examples, the at least one electrical circuit 16 further includes at least one electrical cable, power cable, or electrical wire including at least one electrical conductor material. The at least one electrical cable, power cable, or electrical wire can include a non-metallic wire, a cable insulation sheath, a cable jacket, and/or a wire jacket.

In some examples, the at least one electrical circuit 16 further includes at least one capacitive touch sensor, for example, the at least one capacitive touch sensor can be a sensor electrode grid. For instance, the at least one capacitive touch sensor can include an electrode material. Non-limiting examples of electrode materials include copper, aluminum, and silver.

In some examples, the at least one electrical circuit 16 further includes at least one shield. In cases where the at least one capacitive touch sensor is present, the at least one shield can be placed in close proximity to said at least one capacitive touch sensor. For example, the at least one shield can be placed around the at least one capacitive touch sensor, between the at least one capacitive touch sensor and a source of interference that can impair the proper operation of the at least one capacitive touch sensor, or on at least one side of the at least one capacitive touch sensor. It is to be understood that the at least one shield does not overlap or partially overlap the area of the at least one capacitive touch sensor (i.e. the at least one shield is not in direct contact with the at least one capacitive touch sensor). For example, a gap can be provided between the at least one shield and the at least one capacitive touch sensor. In some examples, the distance between the at least one shield and the at least one capacitive touch sensor is in the range of from about 0.5 mm to about 3 mm, limits included. The at least one shield can be designed to substantially improve the performance and/or the signal-to-noise ratio of the at least one capacitive touch sensor. This can be achieved, for example, by substantially reducing stray (parasitic) capacitance, noise coupling, and electromagnetic interference. It can also be achieved by directing or focusing the sensing zone to a specific area. The at least one shield can be a passive shield or an active shield.

In some examples, the at least one electrical conductor material of the at least one electrical circuit 16 can be a printed electrical conductor material. For example, the at least one electrical conductor material of the at least one electrical circuit 16 can be a conductive ink such as a metal-based ink. Non-limiting examples of metal-based inks include copper-based inks, silver-based inks, and aluminum-based inks. The at least one electrical conductor material can be printed to obtain a printed electrical circuit pattern and so the at least one electrical circuit 16 can be a printed electrical circuit. The printed electrical circuit can be printed directly on the film substrate 20, for example, a thin flexible film substrate. The film substrate 20 can be made of any suitable material known in the art. The material of the film substrate 20 can be selected for its compatibility with various elements of the aircraft, and/or for its electrical, mechanical, chemical, or thermal properties. In one variant of interest, the film substrate 20 is made of plastic. It should be noted that any compatible printing technique is contemplated herein to obtain the printed electrical circuit. In one variant of interest, the printed electrical circuit is obtained by screen printing or serigraphy printing. Similarly, the at least one capacitive touch sensor, and/or the at least one shield of the at least one electrical circuit 16, if present, can also be printed.

In some examples, the at least one electrical circuit 16 can be produced by using a material addition process. The at least one electrical conductor material can be deposited, for example, by a material addition process to obtain an electrical circuit pattern and to produce the at least one electrical circuit 16. For example, the at least one electrical conductor material of the at least one electrical circuit 16 can be a conductive ink such as a metal-based ink. Non-limiting examples of metal-based inks include copper-based inks, silver-based inks, and aluminum-based inks. For example, a filament of the at least one electrical conductor material can be deposited using a material addition process directly on the inner side of the first matrix-permeable fabric preform 14. It should be noted that any material addition process is contemplated herein to obtain the at least one electrical circuit 16. Examples of material addition processes include, without limitation, additive manufacturing processes and metal additive manufacturing processes. Similarly, the at least one capacitive touch sensor, and/or the at least one shield of the at least one electrical circuit 16, if present, can also be produced by a material addition process.

In some examples, the at least one electrical circuit 16 further includes an electrical installation including at least one electromechanical device used to join electrical conductors and create an electrical circuit. For example, the at least one electromechanical device can be an electrical connector. In one variant of interest, the at least one electrical circuit 16 can comprise at least a first electrical connector and a second electrical connector. Any type of compatible electromechanical device is contemplated. For example, the at least one electromechanical device can be selected for its compatibility with various elements of the aircraft to respect ASTM or aircraft standards.

The at least one electrical circuit 16 can either be permanently or removably electrically connected to an external power supply. In cases where two or more composite panels 10 are present, the at least one of the electrical circuit 16 can either be permanently or removably electrically connected to an external power supply and/or to the at least one electrical circuit 16 of at least one adjacent composite panel 10. It is to be understood that at least one of the electrical circuits 16 is electrically connected to an external power supply to form an interconnected electrical power distribution network. Any type of compatible electromechanical device or electrical connector can be used to electrically connect the at least one electrical circuit 16 to the external power supply and/or to the at least one electrical circuit 16 of at least one adjacent composite panel 10. For example, the external power supply can be an aircraft electrical wiring. For instance, the interconnected electrical power distribution network can supply power to the at least one electrical or electronic device. In some examples, the interconnected composite panels 10 can collect data through sensors, transmit the data collected, and control, enable, or disable the at least one electrical or electronic device.

The at least one electrical circuit 16 of the composite panel 10 can either be permanently or removably electrically connected to the at least one electrical or electronic device. Any type of compatible electromechanical device or electrical connector can be used to electrically connect the at least one electrical circuit 16 to the at least one electrical or electronic device.

The at least one electrical or electronic device can be, for example, a lighting system, an automatic window system, a sensor system, a flight display system, a temperature control system, a control unit, a touch-sensitive device, a surveillance system, a piezoelectric device, or an electronic device charging system. For example, the electronic device charging system can be a USB charging port, or an inductive charging system (also known as a wireless or cordless charging system) to charge electronic devices such as smart phones, tablets, and laptops. Non-limiting examples of electrical or electronic devices include a light source (e.g. light-emitting diodes (LEDs), organic light-emitting diodes (OLEDs), and electrochemiluminescence (ECL)-based light-emitting devices), a radiant heating system (e.g. resistive heating systems, and positive temperature control (PTC) systems), a radiant cooling system, a screen, a monitor, a video surveillance system, a video camera, a USB charging port, a wireless charger, a wireless charging pad, a charging wireless station, an automatically dimmable window shade, an automatic window shade, sensors, an aircraft cabin environmental quality sensor (e.g. ozone, cabin pressure, CO, and $CO_2$ sensors), a light sensor, an acoustic sensor, passenger control unit buttons (e.g. a button for controlling a reading light or a cabin attendant call function), seat controls, and other control means such as capacitive touch sensor controls.

Figure 2:
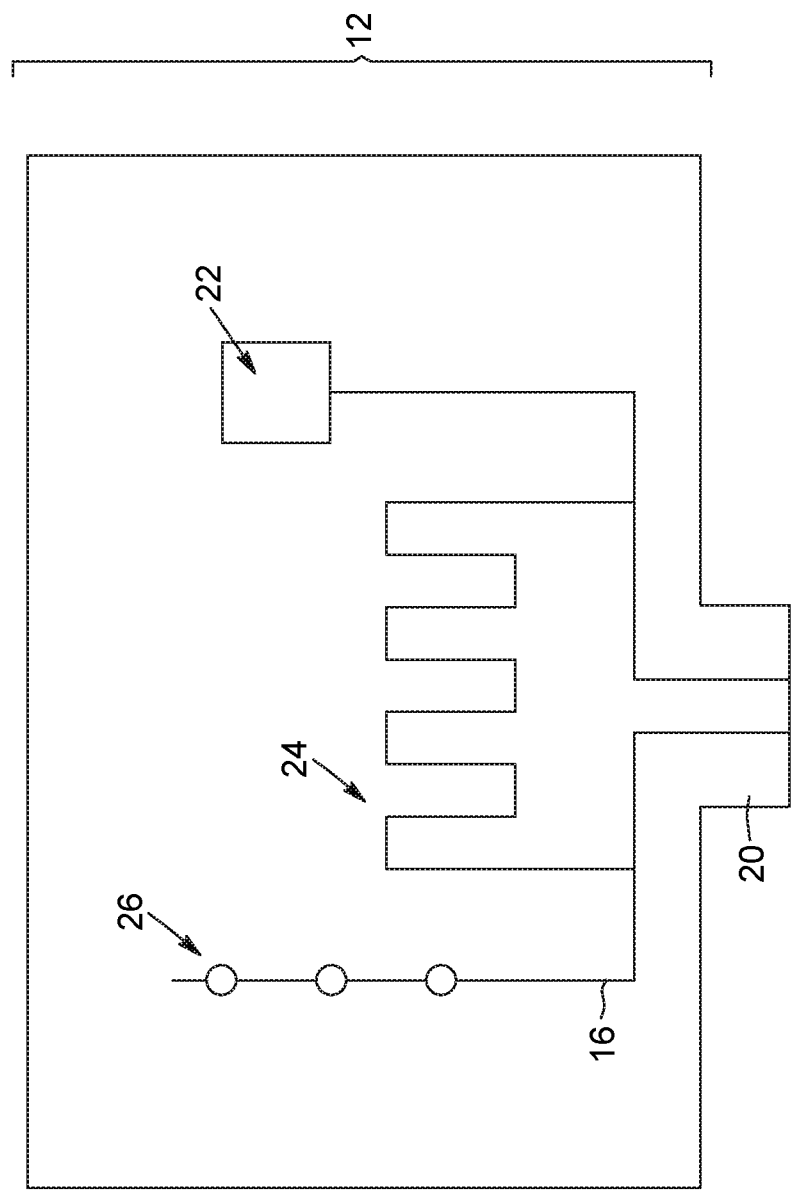
FIG. 2 is a top view image of a composite panel including an integrated electrical circuit in accordance with another illustrative embodiment of the present invention.

Reference is now made to FIG. 2, which provides a schematic illustration of the composite panel including at least one integrated electrical circuit 10 in accordance with a possible embodiment.

As illustrated in FIG. 2, the composite panel 10 includes a matrix-permeable reinforcing material assembly 12, and a matrix (not shown in FIG. 2) both as described herein. The at least one electrical circuit 16 is illustratively provided on a film substrate 20. As shown in FIG. 2, a portion of the at least one electrical circuit 16 and film substrate 20 can protrude from the matrix-permeable reinforcing material assembly 12 of the composite panel 10 to allow for the electrical connection of the at least one electrical circuit 16 to an external power supply or to at least one electrical circuit 16 of at least one adjacent composite panel 10, if present. The composite panel 10 illustratively includes a capacitive touch sensor 22, a heating system 24, and at least one light 26 all connected to the at least one electrical circuit 16. The sensor 22, the heating system 24, and the at least one light 26 being integrated or embedded in the composite panel 10.

Figure 3:
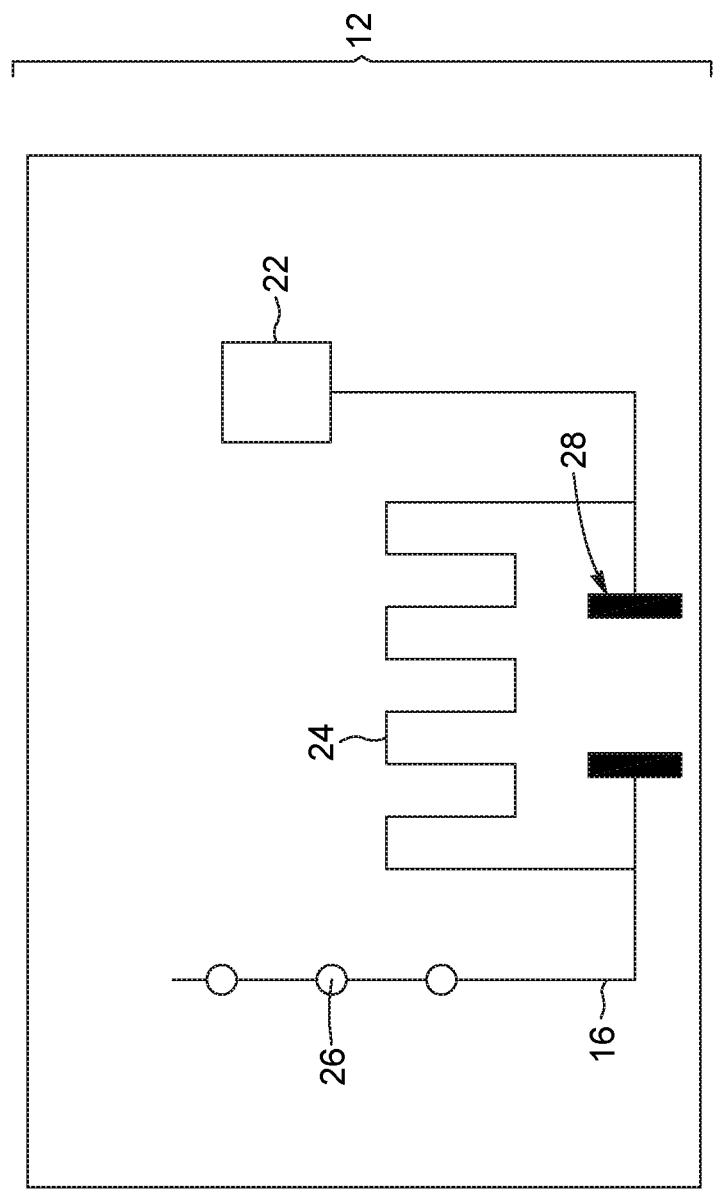
FIG. 3 is a top view image of a composite panel including an integrated electrical circuit in accordance with another illustrative embodiment of the present invention.

Now referring to FIG. 3 in addition to the previous figures, illustratively, and in accordance with one embodiment of the invention, the at least one electrical circuit 16 and film substrate 20 can be completely embedded or integrated in the matrix-permeable reinforcing material assembly 12 of the composite panel 10. As illustrated in FIG. 3, the at least one electrical circuit 16 can include at least one electrical connector 28 which can protrude from the matrix-permeable reinforcing material assembly 12 of the composite panel 10 to allow for the electrical connection of the at least one electrical circuit 16 to an external power supply or to at least one electrical circuit 16 of at least one adjacent composite panel 10, if present.

Figure 4:
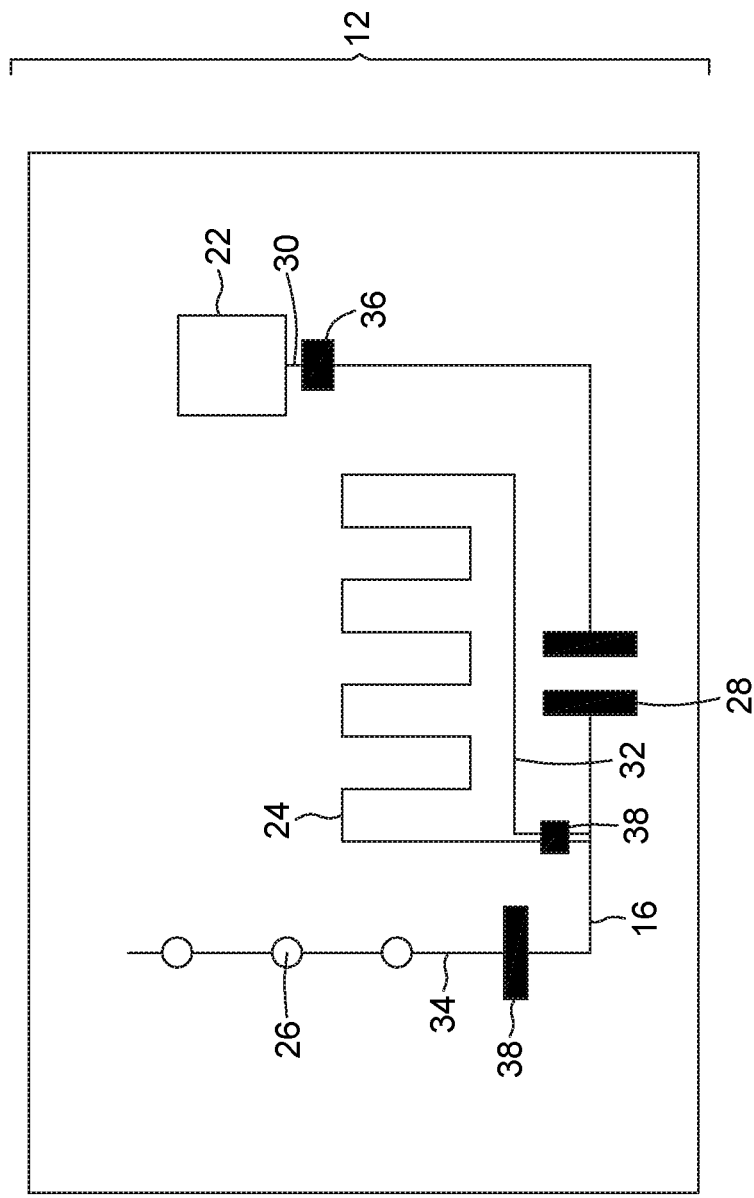
FIG. 4 is a top view image of a composite panel including an integrated electrical circuit in accordance with another illustrative embodiment of the present invention.

Reference is now made to FIG. 4 in addition to the previous figures, illustratively, and in accordance with one embodiment of the invention, the composite panel 10 can include two or more connector systems 30, 32, and 34 which are electrically connected to the at least one electrical circuit 16. In FIG. 4, the capacitive touch sensor 22, the heating system 24, and the at least one light 26 are respectively connected to the connector systems 30, 32, and 34. As shown in FIG. 4, the connector systems 30, 32, and 34 can be electrically connected to the at least one electrical circuit 16 using electrical connectors that are illustrated using reference numerals 36, 38, and 40. In at least one example, the electrical connectors 36, 38, and 40 protrude from the matrix-permeable reinforcing material assembly 12 of the composite panel 10. The capacitive touch sensor 22, the heating system 24, and the at least one light 26 as well as the connector systems 30, 32, and 34 can thus be non-embedded in the composite panel 10.

Figure 5:
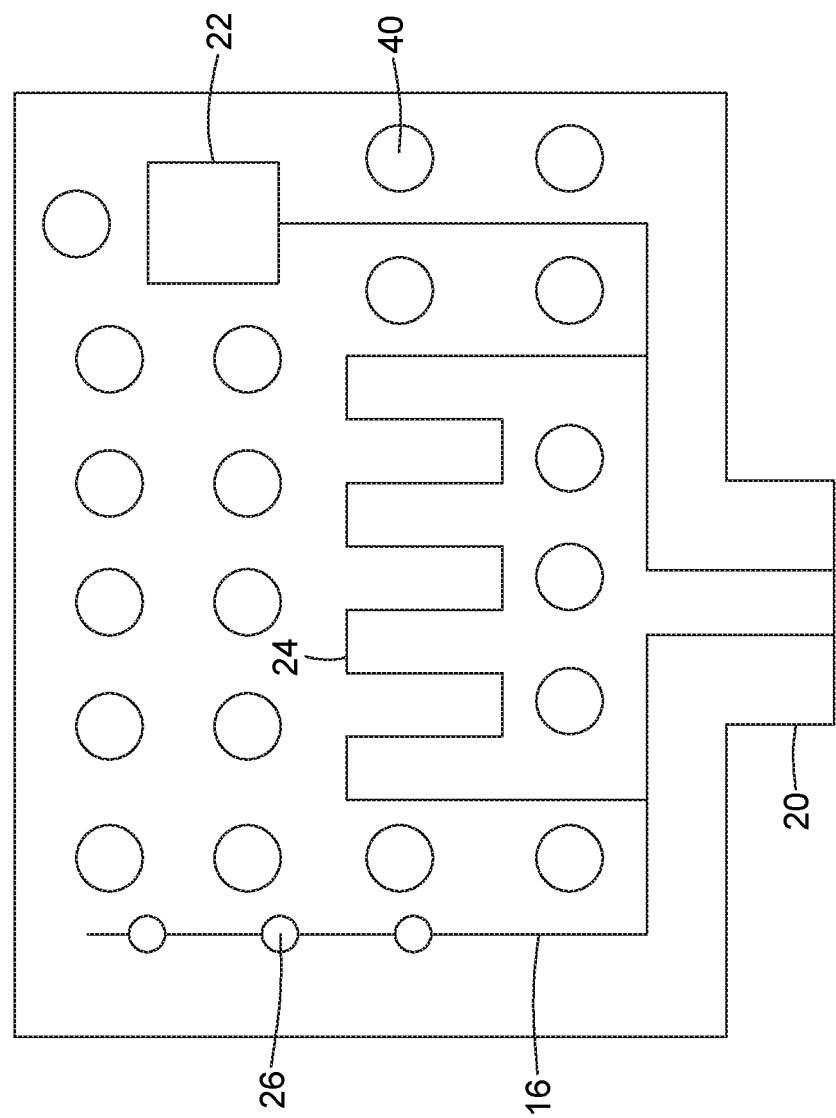
FIG. 5 is a top view image of an electrical circuit provided on a film substrate in accordance with an illustrative embodiment of the present invention.
Figure 6:
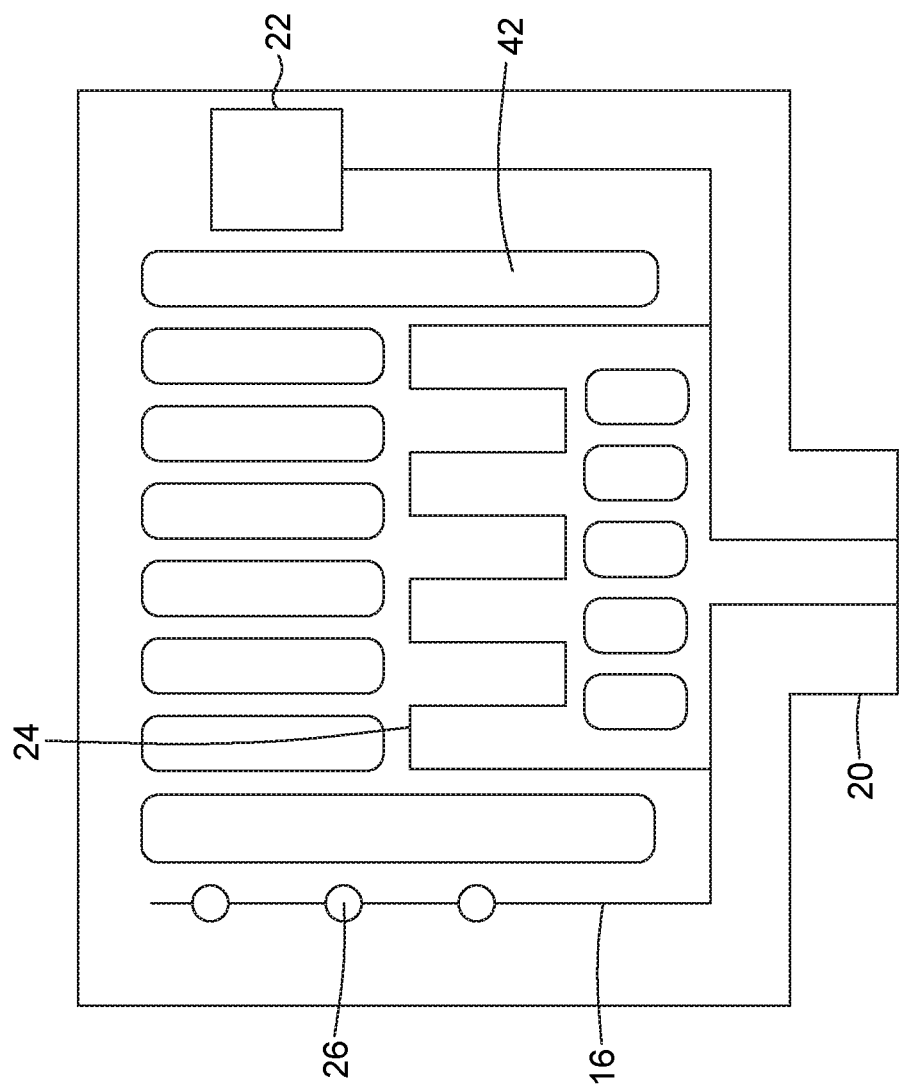
FIG. 6 is a top view image of an electrical circuit provided on a film substrate in accordance with another illustrative embodiment of the present invention.
Figure 7:
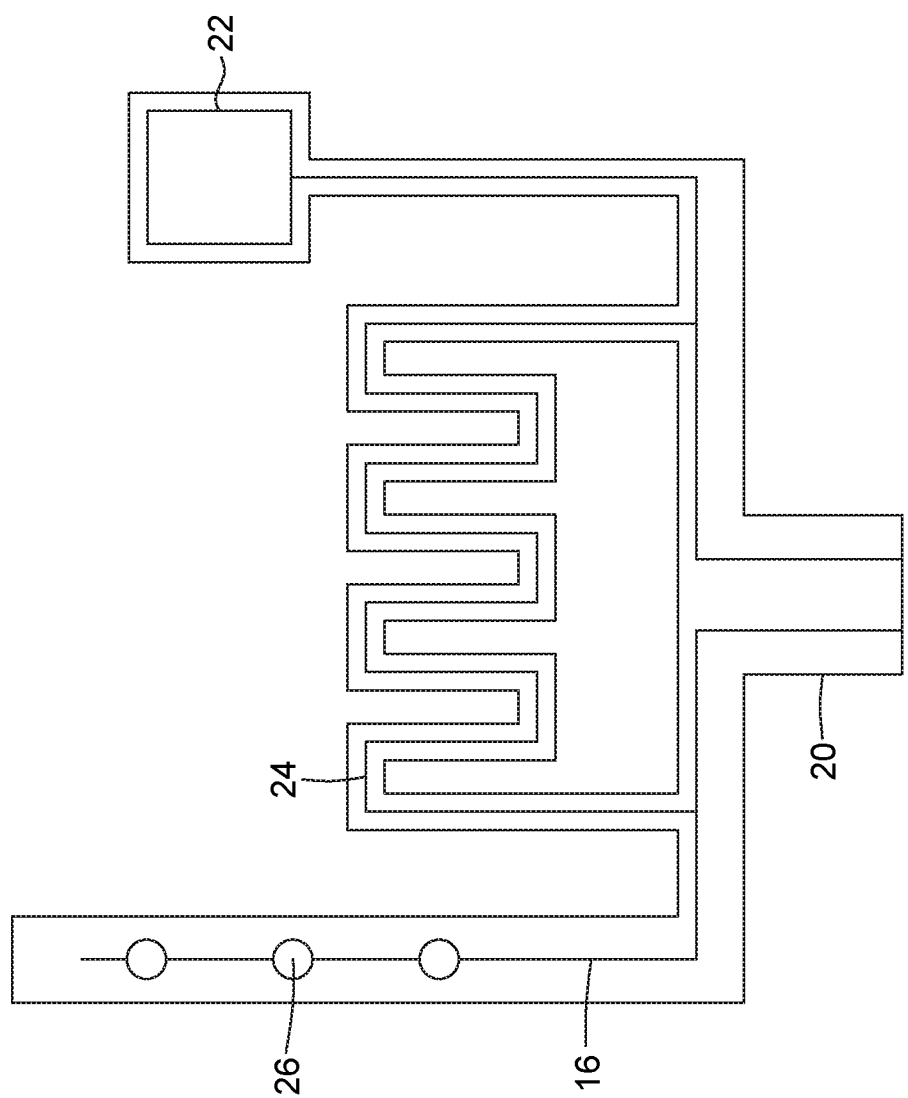
FIG. 7 is a top view image of an electrical circuit provided on a film substrate in accordance with another illustrative embodiment of the present invention.

Now referring to FIGS. 5 to 7 in addition to the previous figures, illustratively, and in accordance with one embodiment of the invention, the film substrate 20 is perforated or designed to minimize the surface area of the film substrate 20. As shown in FIG. 5, the film substrate 20 can be provided with at least one hole 40, and preferably a plurality of holes 40. For example, the at least one hole 40 can be substantially circular. As illustrated in FIG. 6, the film substrate 20 can be provided with at least one opening 42, and preferably a plurality of openings 42. For example, the at least one opening 42 can be substantially rectangular. However, the at least one opening 42 can be of any suitable shape. As described above, the at least one hole 40 or the at least one opening 42 can advantageously be sufficiently large to allow for the passage of the matrix from a first side to a second side of the film substrate 20. As illustrated in FIG. 7, the film substrate 20 can have a configuration that follows the shape of the at least one electrical circuit 16 to minimize the surface area of the film substrate 20. As described above, the film substrate 20 when perforated or designed to minimize the surface area of the film substrate 20 can substantially improve the impregnation of the matrix-permeable reinforcing material assembly 12 by the matrix and thereby can promote a better adhesion between the components of the composite panel 10 and substantially reduce or completely avoid the delamination of the composite panel 10.

Figure 8:
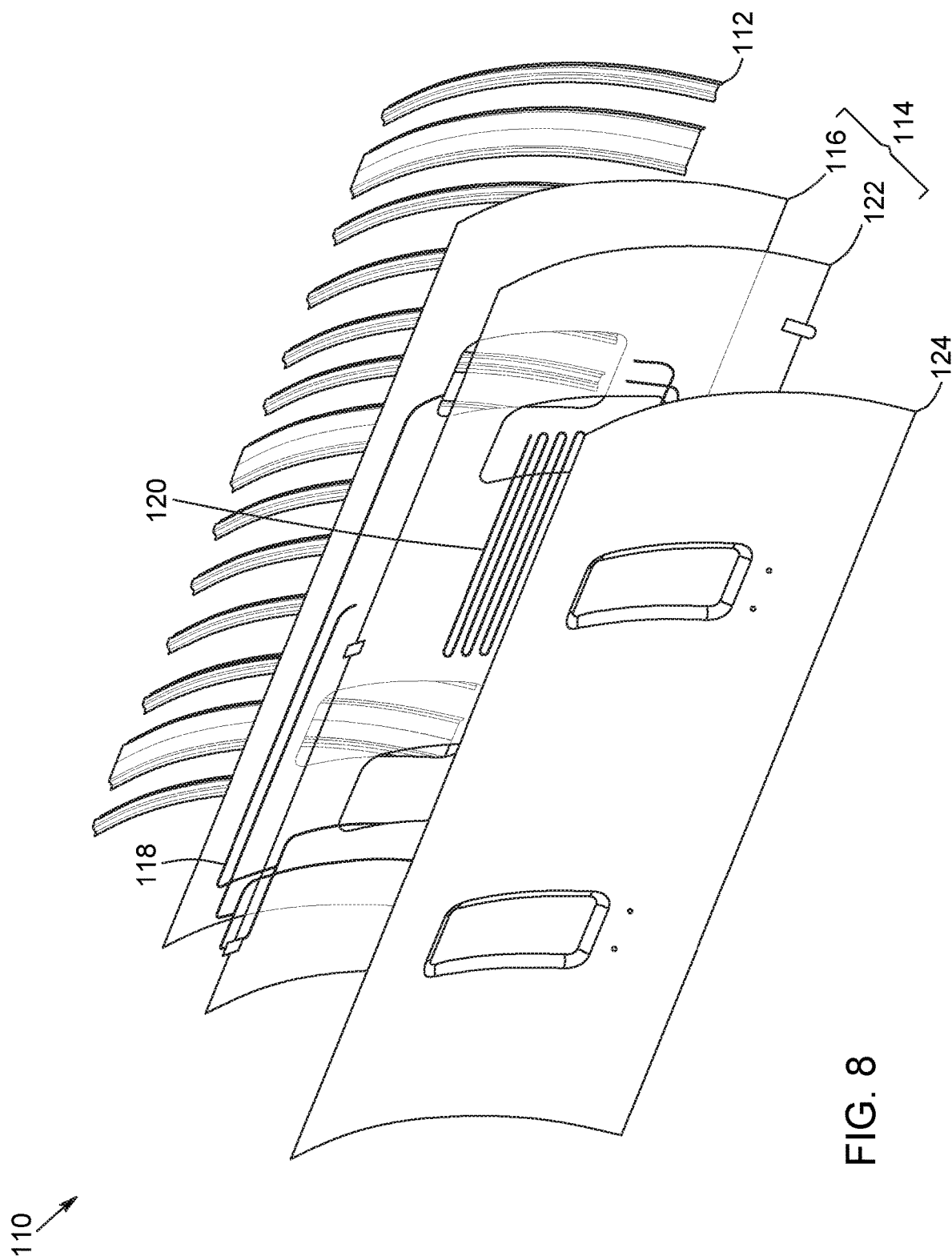
FIG. 8 is a schematic exploded view of a composite panel including an integrated electrical circuit designed for an aircraft side wall in accordance with an illustrative embodiment of the present invention.

Reference is now made to FIG. 8 which provides a schematic exploded view of a composite panel including at least one integrated electrical circuit that is illustrated using reference numeral 110. The composite panel 110 can illustratively be installed inside an aircraft, for example, on the aircraft fuselage or the aircraft structural supports. The composite panel 110 includes a matrix-permeable reinforcing material assembly 114, and a matrix (not shown in FIG. 8). The matrix-permeable reinforced material assembly 114 includes a first matrix-permeable fabric preform 116 having an inner side and an outer side. The outer side of the first matrix-permeable fabric preform 116 being designed to face an integration assembly and a reinforcement assembly 112 respectively designed for the installation of the composite panel 110 on the aircraft structural supports and to increase the strength-to-weight ratio. The matrix-permeable reinforcing material assembly 114 also includes at least one electrical circuit 118 provided on the inner side of the first matrix-permeable fabric preform 116. The matrix-permeable reinforcing material assembly 114 further includes at least one electrical or electronic device 120 connected to the at least one electrical circuit 118. The matrix-permeable reinforcing material assembly 114 further includes a second matrix-permeable fabric preform 122 connected to the first matrix-permeable fabric preform 116. The second matrix-permeable fabric preform 122 facing the inner side of the first matrix-permeable fabric preform 116 adjacent to the at least one electrical circuit 118. The composite panel 110 illustratively further includes a panel cover 124.

Figure 9:
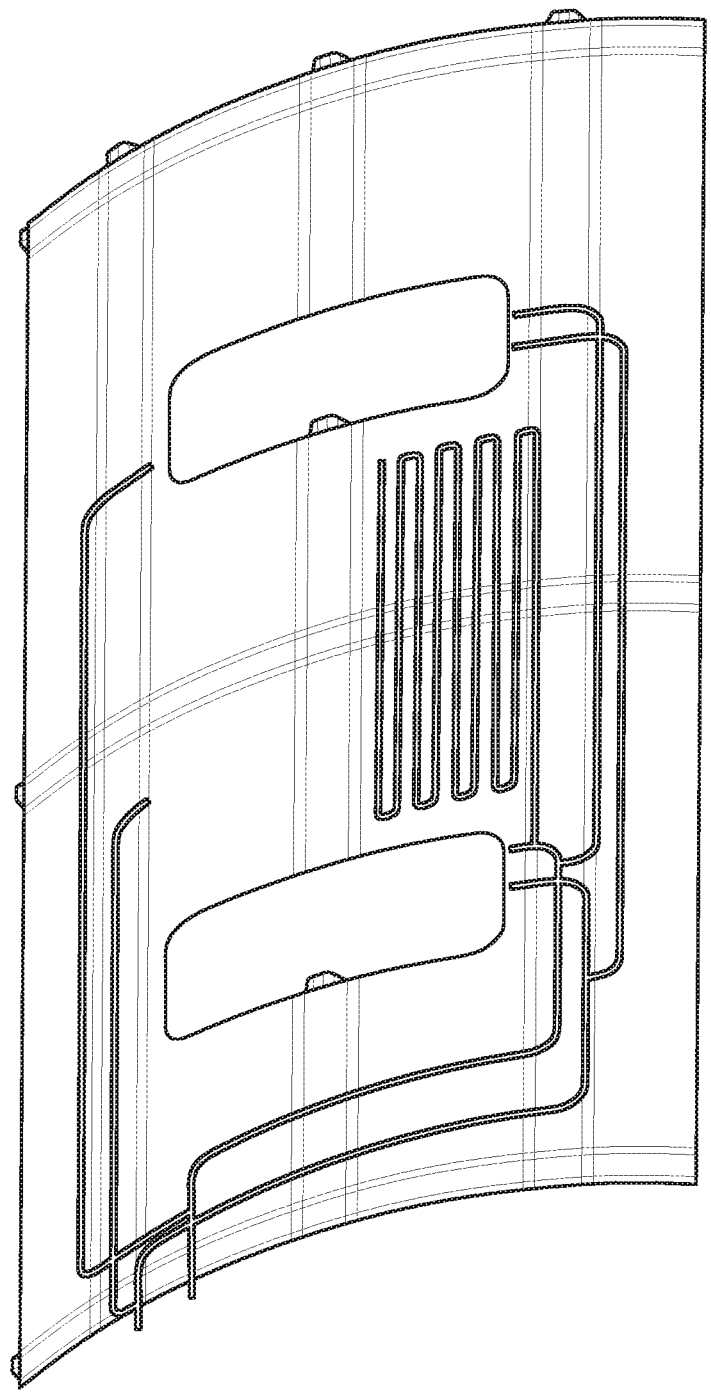
FIG. 9 is a schematic view illustrating a heating system electrically connected to the electrical circuit of a composite panel designed for an aircraft side wall in accordance with an illustrative embodiment of the present invention.

Reference is now made to FIG. 9 which provides a schematic of a heating system that is electrically connected to at least one integrated electrical circuit of a composite panel designed for a side wall of an aircraft.

In some examples, the composite panel 10 can substantially reduce weight associated to electrical and electronic systems. For example, the weight reduction can be in the range of from about 1% to about 35%, or from about 5% to about 35%, or from about 10% to about 35%, or from about 15% to about 35%, or from about 20% to about 30%, when compared to commonly used electrical and electronic systems, including wire harnesses.

In some examples, the composite panel 10 can substantially reduce costs associated to the installation of electrical or electronic systems. For example, cost reduction can be in the range of from about 1% to about 40%, or from about 5% to about 40%, or from about 10% to about 40%, or from about 15% to about 40%, or from about 20% to about 35% when compared to commonly used electrical and electronic systems, including wire harnesses.

The present technology also relates to a composite panel including at least one integrated electrical circuit as herein defined, for use in the transport industry as defined herein. For instance, the composite panel as defined herein can be for use in the aerospace, automotive, aeronautic, and aircraft manufacturing industries, preferably in the aeronautic and aircraft manufacturing industries. For example, the composite as herein defined can be used as an aircraft or an airplane component, for example, such as those mentioned above.

The present technology also relates to an aircraft or airplane component including a composite panel including at least one integrated electrical circuit as herein defined. For instance, the aircraft or airplane component can be an aircraft or airplane interior component, for example, such as those mentioned above.

According to a further aspect, the present technology relates to a process for manufacturing a composite panel including at least one integrated electrical circuit as herein defined, the process including the following steps:
  providing a first matrix-permeable fabric preform and a second matrix-permeable fabric preform, each of the first and second matrix-permeable fabric preforms having an inner side and an outer side;
  providing at least one electrical circuit between the first and second matrix-permeable fabric preforms, wherein said at least one electrical circuit is provided on a film substrate comprising at least one hole and/or opening;
  electrically connecting at least one electrical or electronic device to the at least one electrical circuit;
  connecting the first matrix-permeable fabric preform to the second matrix-permeable fabric preform to obtain a matrix-permeable reinforced material assembly comprising the at least one electrical circuit and the at least one electrical or electronic device; and optionally impregnating the matrix-permeable reinforced material assembly with a matrix to obtain said composite panel including an integrated electrical circuit.

In some examples, the first and second matrix-permeable fabric preforms are matrix-permeable dry fabric preforms, and the process includes the impregnating step which can be performed after the step of connecting the first and second matrix-permeable fabric preforms. The impregnating step can be performed by injection or infusion, for example, using liquid moulding techniques such as RTM, Light RTM, or VARTM. For example, the impregnating step can be carried out by inserting the matrix-permeable reinforced material assembly into a mould, which is subsequently closed, and then injecting a matrix (e.g. a resin). Alternatively, the first and second matrix-permeable fabric preforms are prepreg fabric preforms and are pre-impregnated with the matrix. It is to be understood that the step of impregnating the matrix-permeable reinforced material assembly with a matrix to obtain a composite panel comprising an integrated electrical circuit not required in such cases. For example, the matrix-permeable reinforced material assembly impregnated with the matrix can form a monolithic composite panel, a sandwich-structured composite panel, or a sandwich-structured composite panel with a honeycomb core or a foam core.

In some examples, the process further includes printing at least one electrical circuit on a film substrate to obtain a film substrate including at least one printed electrical circuit.

In some examples, the step of providing at least one electrical circuit can include immobilizing the at least one electrical circuit on the inner side of the first matrix-permeable fabric preform. In one example, the at least one electrical circuit includes an electrical installation and the step of providing at least one electrical circuit can be performed by immobilizing the electrical installation on the inner side of the first matrix-permeable fabric preform. In another example, the at least one electrical circuit includes a printed electrical circuit on a film substrate and the step of providing at least one electrical circuit can be performed by immobilizing the film substrate on the inner side of the first matrix-permeable fabric preform. For example, the step of providing at least one electrical circuit can be performed, for example, by adhesive bonding, or by embroidery techniques such as stitching, chain stitching, running stitching, straight stitching and cross stitching.

In some examples, the step of providing at least one electrical circuit can include depositing the at least one electrical circuit directly on the inner side of the first matrix-permeable fabric preform. For example, at least one electrical conductor material can be deposited directly on the inner side of the first matrix-permeable fabric preform using a material addition process to obtain an electrical circuit pattern and thereby producing the at least one electrical circuit. For instance, a filament of the at least one electrical conductor material can be deposited directly on the inner side of the first matrix-permeable fabric preform using a material addition process. The material addition process can be, for example, an additive manufacturing process (3D printing), or a metal additive manufacturing process. The material addition process can also be used to electrically connect at least one component to the at least one electrical circuit.

In some examples, the step of connecting the first and second matrix-permeable fabric preforms can be performed by any known compatible technique known to connect two or more fabric layers. For example, the step of connecting the first and second matrix-permeable fabric preforms can be performed by adhesive bonding, bond stitching, chain stitching, running stitching, straight stitching, cross stitching, weaving, braiding, twisting, knitting, interlacing, intertwining, or interlooping.

In some examples, the step of impregnating the matrix-permeable reinforced material assembly with the matrix further includes preparatory steps. For instance, the process can further include providing or manufacturing a mould having a predetermined shape and size, for example, depending on the specific needs of the aircraft manufacturer. The process can also include inserting and/or placing the matrix-permeable reinforced material assembly including the at least one electrical circuit and the at least one electrical or electronic device into the cavity of the mould. The process can also further include closing or clamping the cavity the mould. For example, the step of impregnating the matrix-permeable reinforced material assembly with the matrix can include injecting the matrix into the mould. For instance, the matrix can be pumped or injected into the mould until the cavity of the mould is substantially filled, for example, the air originally present in the cavity of the mould can be displaced through vents. In some examples, the mould can be heated and/or pressurized. In some examples, the process further includes a step of curing the matrix in which the matrix can be substantially hardened by cross-linking. For instance, the curing time is selected based on the temperature of the mould and the composition of the matrix being used. The process can also include removing the composite panel thus obtained from the mould.

In some examples, the step of providing the first and second matrix-permeable fabric preforms can include a step of providing pores in at least one of the first and second matrix-permeable fabric preforms to significantly facilitate the penetration of the matrix in the matrix-permeable reinforced material assembly. The pores in the first and/or second matrix-permeable fabric preforms can be provided, for example, by perforation or punching. For instance, the pores in the first and/or second matrix-permeable fabric preforms can lead to the formation of air pockets in the matrix-permeable reinforced material assembly which may substantially improve the impregnation of the matrix-permeable reinforced material assembly with the matrix. For instance, the impregnation of the matrix-permeable reinforced material assembly with the matrix can be substantially complete (i.e. substantially void free impregnation) to ensure an optimal adhesion between the different components of the composite panel and substantially reduce or avoid the delamination of the composite panel.

In cases where the at least one electrical circuit includes a printed electrical circuit on a film substrate, the process can further include a step of providing the film substrate with at least one hole and/or opening. In such cases, the process preferably includes providing the film substrate with a plurality of holes and/or openings. For example, the step of providing the film substrate with at least one hole and/or opening can be performed by perforating, cutting, and/or punching the film substrate. The perforation, cutting, and/or punching can be performed by any compatible technique known in the art including, but not limited to, a laser cutting technique.

In some example, the process further includes a step of permanently or removably electrically connecting the at least one electrical circuit to an external power supply and/or to at least one electrical circuit of at least one adjacent composite panel, if two or more composite panels are present. It is to be understood that at least one electrical circuit of at least one composite panel is electrically connected to an external power supply to form an interconnected electrical power distribution network.

In some examples, the process further includes a step of permanently or removably electrically connecting the at least one electrical circuit to the at least one electrical or electronic device.

In some examples, the process further includes a step of providing an integration or installation assembly. For example, the step of providing an integration or installation assembly can be carried out by moulding the integration or installation assembly in the composite panel.

In some examples, the process further includes a step of providing a reinforcement assembly. For example, the step of providing a reinforcement assembly can be carried out by moulding the reinforcement assembly in the composite panel.

In some examples, the process further includes a step of providing a panel cover or lining. For example, the step of providing a panel cover or lining can be performed by moulding the panel cover or lining in the composite panel.

Although optional embodiments of the invention have been described in detail herein and illustrated in the accompanying drawings, it is to be understood that the invention is not limited to these precise embodiments and that various changes and modifications may be effected therein without departing from the scope of the invention.

The invention claimed is:

1. A composite panel having at least one integrated electrical circuit, the composite panel comprising:
   a matrix; and
   a matrix-permeable reinforced material assembly comprising:
      a first matrix-permeable fabric preform and a second matrix-permeable fabric preform extending in a superposed relationship;
      at least one electrical circuit provided on a plastic film substrate, wherein the at least one electrical circuit is placed between the first and second matrix-permeable fabric preforms, and the plastic film substrate comprises at least one hole and/or opening connecting an inner side of the first matrix-permeable fabric preform to an inner side of the second matrix-permeable fabric preform so that the matrix impregnates said first and second matrix-permeable matrix preforms, wherein the at least one electrical circuit and plastic film substrate comprise a portion which protrudes from the matrix-permeable reinforced material assembly; and
      at least one electrical or electronic device electrically connected to the at least one electrical circuit.

2. The composite panel of claim 1, wherein the first and the second matrix-permeable fabric preforms are dry fabric preforms or are pre-impregnated with the matrix.

3. The composite panel of claim 1, wherein the plastic film substrate has a surface area of less than about 85%, or less than about 75%, or less than about 65%, or less than about 55%, or less than about 45%, or less than about 35%, or less than about 25%, or less than 15%, or less than about 5% of the surface area of the composite panel.

4. The composite panel of claim 1, wherein the first and the second matrix-permeable fabric preforms are independently selected from the group consisting of woven, non-woven, knitted, and braided fabric preforms, and/or independently comprise high-performance multifilament fibers selected from the group consisting of glass fibers, carbon fibers, hybrid carbon-glass fibers, aramid fibers, boron fibers, basalt fibers, and natural fibers.

5. The composite panel of claim 1, wherein the matrix is a thermoset resin or a thermoplastic resin selected from the group consisting of epoxy resins, phenolic resins, vinyl ester resins, polyester resins, polyurethane resins, cyanate ester resins silicone rubber, polyetherimide (PEI), polyphenylsulfone (PPSU), polyetheretherketone (PEEK), polyphenylene sulfide (PPS), polyetherketoneketone (PEKK), polyaryletherketon (PAEK), polycarbonates (PC), and polyamide (PA).

6. The composite panel of claim 1, wherein the at least one electrical circuit is a printed electrical circuit and is completely or partially embedded in the composite panel.

7. The composite panel of claim 1, wherein the at least one electrical circuit comprises at least one electrical conductor material selected from the group consisting of copper, aluminum, and silver, preferably the at least one electrical conductor material is copper.

8. The composite panel of claim 1, wherein the at least one electrical circuit comprises an electrical installation, and/or at least one electrical cable, power cable, or electrical wire including at least one electrical conductor material, and/or at least one electrical connector.

9. The composite panel of claim 1, wherein the at least one electrical or electronic device is selected from the group consisting of a lighting system, an automatic window system, a sensor system, a flight display system, a temperature control system, a control unit, a touch-sensitive device, a surveillance system, a piezoelectric device, and an electronic device charging system, and preferably selected from the group consisting of a light source, a light-emitting diode, an organic light-emitting diode, an electrochemiluminescence-based light-emitting device, a radiant heating system, a resistive heating system, a positive temperature control system, a radiant cooling system, a screen, a monitor, a video surveillance system, a video camera, a USB charging port, a wireless charger, a wireless charging pad, a charging wireless station, an automatically dimmable window shade, an automatic window shade, a sensor, an aircraft cabin environmental quality sensor, an ozone sensor, a cabin pressure sensor, a carbon monoxide sensor, a carbon dioxide sensor, a light sensor, an acoustic sensor, a passenger control unit button, a button for controlling a reading light, a flight attendant call button, a seat control and capacitive touch sensor controls, and wherein the at least one electrical or electronic device is completely embedded in the composite panel or is separated from the composite panel.

10. The composite panel of claim 1, wherein one or more electrical circuit of the at least one electrical circuit is electrically connected to an external power supply, preferably the external power supply is an aircraft electrical wiring.

11. The composite panel of claim 1, wherein the composite panel further comprises at least one of an integration or installation assembly, a reinforcement assembly, and a panel cover or lining, preferably moulded in the composite panel.

12. The composite panel of claim 1, wherein the composite panel is a monolithic composite panel, a sandwich-structured composite panel, or a sandwich-structured composite panel with a honeycomb core or a foam core.

13. The composite panel of claim 1, wherein said composite panel is designed to be modular, the composite panel interconnects with at least one adjacent composite panel, more preferably a plurality of said composite panels are interconnected to form a composite panel section comprising a plurality of composite panels, and even more preferably the at least one electrical circuit of each composite panel is electrically connected to the at least one electrical circuit of the at least one adjacent composite panel and wherein at least one of the electrical circuit is electrically connected to an external power supply to form an interconnected electrical power distribution network.

14. The composite panel of claim 1, wherein said composite panel is for use in an aircraft.

15. An aircraft component comprising a composite panel as defined in claim 1, preferably said aircraft component is an aircraft interior component is selected from the group consisting of a lining panel, a decor panel, a cabin panel, a cockpit panel, an entrance panel, a service area panel, a baggage compartment panel, a cargo compartment panel, a wardrobe panel, a lavatory panel, a sidewall panel, a cabin sidewall, a cabin console, a side console, a central pedestal, a glare shield skin, a window post, a cabin bulkhead, a bulkhead, a lower wall panel, a ceiling panel, a cabin backseat shell, a headliner, a passenger service unit panel, a door or doorframe panel, a floor panel, and a reported part connected to the composite panel.

16. A process for manufacturing a composite panel as defined in claim 1, the process comprising the following steps:
   providing a first matrix-permeable fabric preform and a second matrix-permeable fabric preform, each of the first and second matrix-permeable fabric preforms having an inner side and an outer side;
   providing at least one electrical circuit between the first and second matrix-permeable fabric preforms, wherein said at least one electrical circuit is provided on a film substrate comprising at least one hole and/or opening;
   electrically connecting at least one electrical or electronic device to the at least one electrical circuit; and
   connecting the first matrix-permeable fabric preform to the second matrix-permeable fabric preform to obtain a matrix-permeable reinforced material assembly comprising the at least one electrical circuit and the at least one electrical or electronic device.

17. The process of claim 16, wherein the first and second matrix-permeable fabric preforms are dry fabric preforms and the process further comprises impregnating the matrix-permeable reinforced material assembly with a matrix, preferably the impregnating step is performed by a liquid moulding technique selected from resin-transfer moulding, light resin transfer moulding, and vacuum assisted resin transfer moulding.

18. The process of claim 16, further comprising at least one of the following steps: printing the at least one electrical circuit on the film substrate, providing the film substrate with the least one hole and/or opening, electrically connecting the at least one electrical circuit to an external power supply, providing an electrical installation, providing an integration or installation assembly, providing a reinforcement assembly, and providing a panel cover or lining.

19. The process of claim 16, wherein the step of providing the at least one electrical circuit is performed by immobilizing the at least one electrical circuit on the inner side of the first matrix-permeable fabric preform.

20. The process of claim 16, further comprising electrically connecting the at least one electrical circuit to the at least one electrical circuit of the at least one adjacent composite panel and electrically connecting at least one of the electrical circuits to an external power supply to form an interconnected electrical power distribution network.

\* \* \* \* \*